United States Patent [19]

Tsunoda

[11] Patent Number: 4,920,062
[45] Date of Patent: Apr. 24, 1990

[54] MANUFACTURING METHOD FOR VERTICALLY CONDUCTIVE SEMICONDUCTOR DEVICES

[75] Inventor: Tetsujiro Tsunoda, Tokyo, Japan

[73] Assignee: Kabushiki Kaisha Toshiba, Kanagawa, Japan

[21] Appl. No.: 352,538

[22] Filed: May 16, 1989

[30] Foreign Application Priority Data

Oct. 19, 1988 [JP] Japan .................................. 63-263148

[51] Int. Cl.$^5$ .................. H01L 21/223; H01L 21/265
[52] U.S. Cl. ......................................... 437/6; 437/29; 437/40; 437/95; 437/228; 148/DIG. 126
[58] Field of Search ................. 437/6, 29, 40, 41, 228, 437/95, 953; 357/38, 39, 23.4; 148/141, DIG. 126

[56] References Cited

U.S. PATENT DOCUMENTS 4,364,073 12/1982 Becke et al. ........................... 357/23
4,696,701 9/1987 Sullivan ................................. 437/95

FOREIGN PATENT DOCUMENTS 0071915 2/1983 European Pat. Off. .............. 437/95

OTHER PUBLICATIONS

Kuo et al., "Optimization of Epitaxial Layers for Power Bipolar-MOS Transistor," IEEE Electron Device Letters, vol. EDL-7, No. 9, pp. 510-512, Sep. 1986.

Primary Examiner—Brian E. Hearn
Assistant Examiner—T. Thomas
Attorney, Agent, or Firm—Finnegan, Henderson, Farabow, Garrett and Dunner

[57] ABSTRACT

A first semiconductor layer is formed on a semiconductor anode layer containing a high concentration of impurity of a first conductivity type. This first semiconductor layer contains an impurity in a lower concentration than the impurity concentration of the anode layer on which it is formed. A second semiconductor layer containing a high concentration of impurity of a second conductive type is formed on the first semiconductor layer, and a third semiconductor layer containing a low concentration of impurity of the second conductive type is formed on the second semiconductor layer. Impurity regions of at least the first conductivity type are formed by thermal diffusion in the surface region of this third semiconductor layer. During the thermal diffusion, the impurity contained in the anode layer diffuses into the first semiconductor layer. However, the concentration and thickness of the first semiconductor layer are specified so that, even after thermal diffusion, the concentration of the second semiconductor layer is not essentially changed, and thus a semiconductor device which has a thin, high concentration buffer layer can be provided by this production method.

9 Claims, 8 Drawing Sheets

IMPURITY CONCENTRATION

MANUFACTURING METHOD FOR VERTICALLY CONDUCTIVE SEMICONDUCTOR DEVICES

BACKGROUND OF THE INVENTION

This invention relates to manufacturing methods for semiconductor devices, particularly those used in insulated gate bipolar transistors (IGBT) and static induction (SI) thyristors.

In recent years attention has been focussed on IGBT and SI thyristors as large power switching devices. These semiconductor devices are described below with reference to the drawings.

Figure 1:
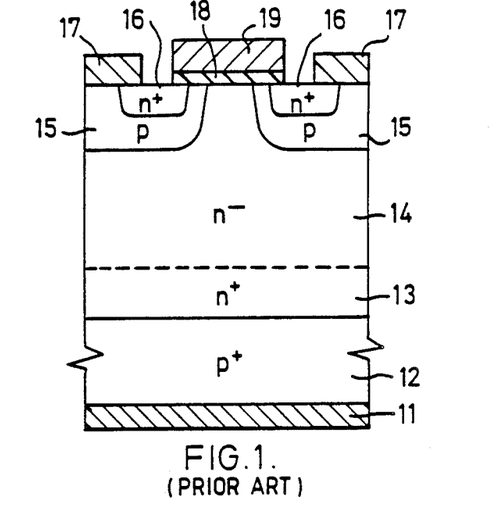
FIGS. 1 and 2 are respectively cross-sectional views of prior art semiconductor devices.

FIG. 1 is a cross-sectional view showing the construction of an IGBT element. High impurity concentration $n^+$ buffer layer 13 is formed on high impurity concentration $p^+$ type semiconductor substrate 12 which is provided with anode electrode (collector electrode) 11. Low impurity concentration $n^-$ type semiconductor layer 14 is formed on $n^+$ buffer layer 13, p type impurity regions 15 are formed in the surface region of $n^-$ type semiconductor layer 14, and high impurity concentration $n^+$ type impurity regions 16 are formed in these p type impurity regions 15. Cathode electrodes (emitter electrodes) 17 are provided on these p type impurity regions 15 and $n^+$ type impurity regions 16. Also, gate electrode 19 is formed on surfaces of p type impurity region 15 and $n^-$ type semiconductor layer 14 with gate insulating film 18 interposed.

Figure 2:
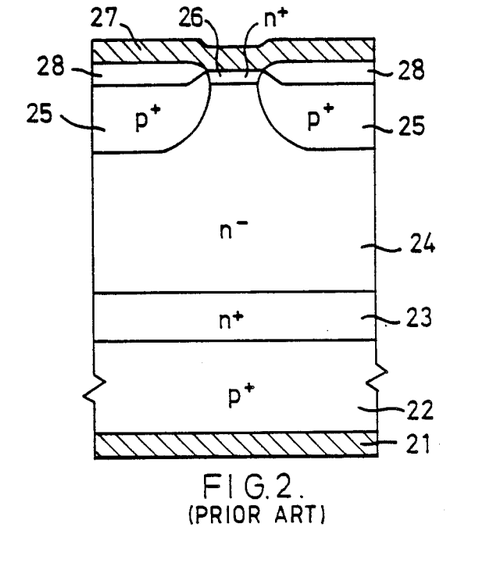

FIG. 2 is a cross-sectional view showing the construction of a SI thyristor element. In the same way as in the IGBT in FIG. 1, high impurity concentration $n^+$ buffer layer 23 and low impurity concentration $n^-$ type semiconductor layer 24 are formed on high impurity concentration $p^+$ type semiconductor substrate 22 which is provided with anode electrode 21. Also, high impurity concentration $p^+$ type impurity regions 25, which function as the gate and high impurity concentration $n^+$ type impurity region 26, are formed by thermal diffusion in the surface region of $n^-$ type semiconductor layer 24. Cathode electrode 27 is provided on $n^+$ type impurity region 26, and insulating films 28 are formed on $p^+$ impurity regions 25.

These semiconductor devices can cut off the main current flowing through the device by gate control. Characteristically the current density of these devices can be made higher than in an MOS FET, in which only majority carriers contribute to the current, since $n^-$ type semiconductor layers 14 or 24 cause conductivity modulation by minority carriers (holes) which are injected in high-resistance $n^-$ type semiconductor layers 14 or 24 from $p^+$ type semiconductor substrates 12 or 22 through buffer layers 13 or 23. Moreover, when compared with bipolar transistors, it is known that, as well as high-speed switching being possible, there being less lost power and there being high breakdown voltage, there is also low ON resistance. However, there are some incompatible characteristics of these devices. For example, there is a trade-off relationship between high-speed switching and the production of low ON resistance. To improve this trade-off, that is to achieve low ON resistance as well as high-speed switching, it is necessary to form thin high impurity concentration $n^+$ buffer layers 13 and 23.

The manufacturing method for the IGBT shown in FIG. 1 will be described with reference to FIG. 3(a) to FIG. 3(c). The same symbols are used in FIG. 3 where applicable.

Figure 3A:
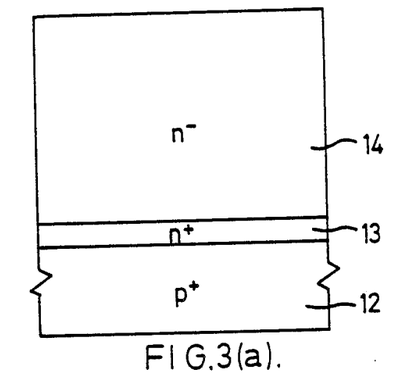
FIGS. 3(a) and 3(b) are respectively cross-sectional view illustrating the manufacturing method for the semiconductor device shown in FIG. 1.
Figure 3B:
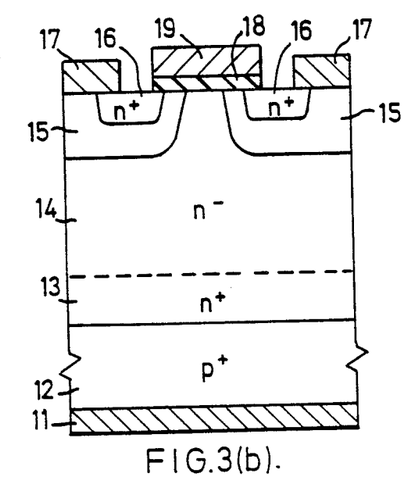
Figure 3C:
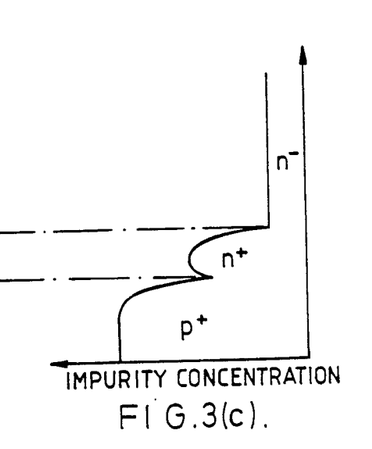
FIG. 3(c) is a drawing showing the impurity concentration profile in the cross-sectional view of the semiconductor device shown in FIG. 3(b).

First, as shown in FIG. 3(a), thin high impurity concentration $n^+$ buffer layer 13, in which phosphorus (P) is typically the dopant, is formed by expitaxial growth on high impurity concentration $p^+$ type semiconductor substrate 12. Low impurity concentration $n^-$ type semiconductor layer 14, in which phosphorus (P) is the dopant, is formed by expitaxial growth on $n^+$ buffer layer 13. Next, as shown in FIG. 3(b), p type impurity regions 15 are formed in the surface portion of this $n^-$ semiconductor layer 14 by thermal diffusion, and then $n^+$ type regions 16 are formed in the surface portion of these p type impurity regions 15 by thermal diffusion. At the same time, the phosphorus in $n^+$ buffer layer 13 diffuses into $n^-$ type semiconductor layer 14. After this, gate insulating film 18 and gate electrode 19 are formed on surfaces of p type impurity region and $n^-$ type semiconductor layer 14. Furthermore, anode electrode 11 is provided on semiconductor substrate 12, and cathode electrodes 17 are provided on p type impurity regions 15 and $n^+$ type impurity regions 16. FIG. 3(c) shows the impurity profile of the semiconductor device of FIG. 3(b).

In this process, assuming the diffusion coefficient of the dopant in $n^+$ buffer layer 13 is large, forming p type impurity regions 15 and $n^+$ type impurity regions 16 (in the SI thyristor, $p^+$ type impurity regions 25 and $n^+$ impurity regions 26) in the surface region of $n^-$ type semiconductor layer 14 by thermal diffusion causes the dopant of $n^+$ buffer layer 13 to also be diffused and thus a thin high impurity concentration $n^+$ buffer layer 13 is not obtained. Therefore, when a dopant with a large diffusion factor, such as phosphorus, is used, both high-speed and low ON resistance cannot be achieved.

On the other hand, if the dopant of $n^+$ buffer layer 13 is arsenic (As), antimony (Sb) or bismuth (Bi) which have small diffusion coefficients, the dopant (for example boron (B)) of the $p^+$ type semiconductor substrate 12 will have a larger diffusion coefficient than any of these dopants. For this reason, significant mutual diffusion of the dopant of $n^+$ buffer layer 13 and the dopant of $p^+$ type semiconductor substrate 12 occurs due during the thermal diffusion process. Therefore, reduction of the concentration in $n^+$ buffer layer 13, disappearance of the $n^+$ buffer layer 13 which depends on the diffusion time, and diffusion of the impurities of $p^+$ type semiconductor substrate 12 to the $n^-$ semiconductor layer 14 can occur. Even if impurities with small diffusion coefficients are used as dopants of the $n^+$ buffer layer 13, a thin high concentration $n^+$ buffer layer 13 still cannot be obtained.

As a result, in the semiconductor manufacturing method described above, a thin high concentration buffer layer is extremely difficult to form. Consequently semiconductor devices which have both high speed switching and also low ON resistance cannot be produced.

SUMMARY OF THE INVENTION

The object of this invention is to provide a manufacturing method for semiconductor devices having thin, high concentration buffer layers, even after thermal diffusion processing.

In order to achieve the above object in the manufacturing method of this invention a first semiconductor layer is formed having a lower impurity concentration than that of the anode layer on which it is formed, the anode layer having a high concentration of impurity of a first conductive type. A second semiconductor layer, containing a high concentration of impurity of a second conductive type, is formed on the first semiconductor layer, and a third semiconductor layer having a low concentration of impurity of the second conductive type is formed on the second semiconductor layer.

Then, a first conductive type impurity region is formed in the surface region of the third semiconductor layer by thermal diffusion. During the diffusion, the impurity contained in the anode layer is diffused into the first semiconductor layer. The concentration and thickness of the first semiconductor layer are determined so that the impurity concentration of the second semiconductor layer does not substantially change during diffusion.

By using this kind of manufacturing method, a thin second semiconductor layer which contains a high impurity concentration can be formed, and even after thermal diffusion processing, a semiconductor device which has a thin high concentration buffer layer can be obtained.

Other objects and many of the attendant advantages of this invention will be readily appreciated as understood by reference to the following detailed description when considered in connection with the accompanying drawings in which like reference characters designate the same or similar parts throughout the figures.

DESCRIPTION OF THE PREFERRED EMBODIMENT

Figure 4A:
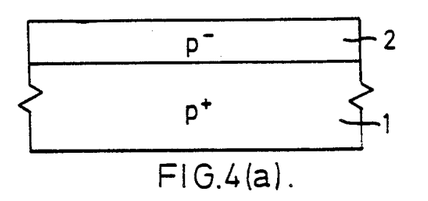
FIG. 4(a) to FIG. 4(g) are cross-sections illustrating the manufacturing method of a semiconductor device in accordance with an embodiment of this invention.
Figure 4B:
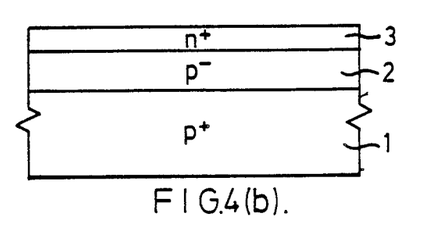

FIG. 4(a) to FIG. 4(g) show the manufacturing method for making the semiconductor device of this invention. First, as shown in FIG. 4(a), low impurity concentration p$^-$ type semiconductor layer 2, for example containing boron (B), with an impurity concentration of $10^{14} \sim 5 \times 10^{16}$ cm$^{-3}$ is formed by silicon (Si) epitaxial growth on high impurity concentration p$^+$ type semiconductor substrate 1 composed of silicon (Si) containing boron (B) with an impurity concentration of $10^{18} \sim 10^{20}$ cm$^{-3}$. The thickness of this p$^-$ type semiconductor layer 2 is set at a value at which a high impurity concentration ($10^{18} \sim 10^{20}$ cm$^{-3}$) will be formed throughout the whole layer during the thermal processing. Then, as shown in FIG. 4(b), n$^+$ buffer layer 3 with a high impurity concentration of $10^{16} \sim 10^{18}$ cm$^{-3}$ is formed by epitaxial growth on low impurity concentration p$^-$ type semiconductor layer 2. This high impurity concentration n$^+$ type buffer layer 3 is grown using elements with a small diffusion coefficient such as arsenic (As), antimony (Sb) or bismuth (Bi) as impurities (dopants).

It has been experimentally determined that the thickness of n$^+$ buffer layer 3 should be within the range of 5 um -10 um. If the thickness is less than 5 um, the control of the impurity diffusion thickness in the p$^-$ type semiconductor layer is unstable. If the thickness is more than 10 um, the impurity profiles of the n$^+$ buffer layer and other impurity doped regions are distorted during the longer heating process required to eliminate the p$^-$ type layer.

Also, if the n$^+$ buffer layer is to function as intended, the impurity concentration of the p$^-$ type semiconductor layer 2 must be within the range of $10^{14}$ to $10^{16}$ atoms/cm$^3$. The impurity concentration of the p$^+$ type semiconductor substrate 1 must be greater than that of p$^-$ type semiconductor layer 2. There is no necessary relationship between the impurity concentration and the thickness of the p$^-$ type semiconductor layer.

It is preferred that the n$^+$ buffer layer have a thickness of 5 um and an impurity concentration of $10^{17}$ atoms/cm$^3$. However, it can have a thickness between 5 um and 10 um with concentration of $10^{16}$ atoms/cm$^3$ or greater. If the thickness is greater than 20 um, the conduction resistance becomes too high.

Figure 4C:
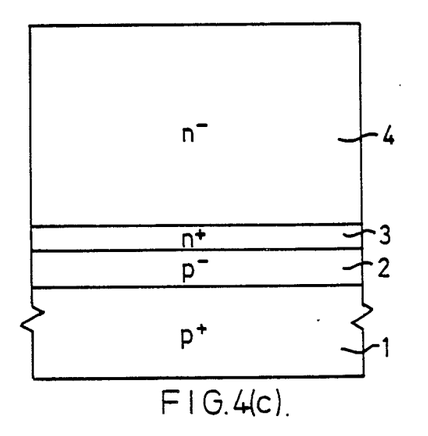
Figure 4D:
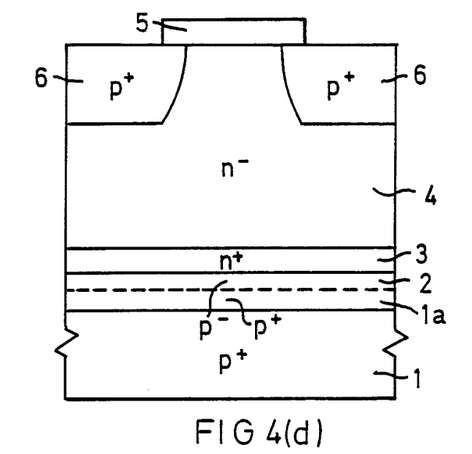

After the step shown in FIG. 4(b) low impurity concentration n$^-$ type semiconductor layer 4 is formed by silicon (Si) epitaxial growth on high impurity concentration n$^+$ type buffer layer 3 as shown in FIG. 4(c). Next, as shown in FIG. 4(d), an insulating film is formed on n$^-$ type semiconductor layer 4, and p$^+$ type impurity regions 6 are selectively formed by the thermal diffusion of boron (B) after providing openings over the regions predetermined for p$^+$ type semiconductor regions 6. At this time, the impurity (for instance, boron (B) in p$^+$ type semiconductor substrate 1 diffuses into p$^-$ type semiconductor layer 2, which is changed to p$^+$ type to the thickness shown by the broken line. Thus, p$^+$ type impurity layer 1a is formed in continuation with p$^+$ type semiconductor substrate. 1.

Figure 4E:
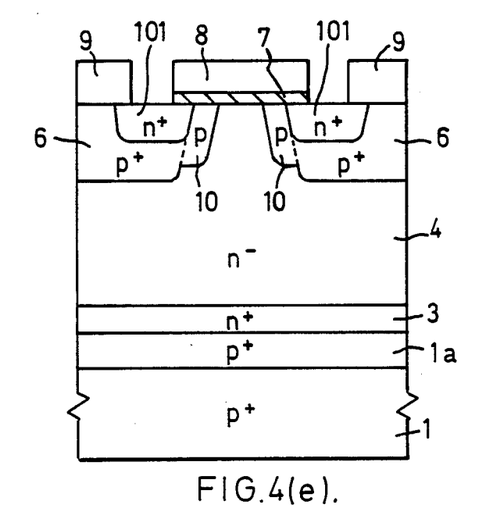

Furthermore, as shown in FIG. 4(e), insulating layer 5 in FIG. 4(d) is removed, and gate insulating film 7 and polycrystalline silicon layer 8, which becomes the gate electrode, are selectively formed so that at least the surface of n$^-$ type semiconductor layer 4 between p$^+$ type impurity regions 6 is covered. Also, in order to provide portions of p$^+$ type impurity regions 6 which will connect with the cathodes, insulating films 9 which are separated from gate insulating film 7 and polycrystalline silicon layer 8 are selectively formed. Then, p type impurity regions 10, doped with boron (B) to a comparatively low impurity concentration, and n$^+$ type impurity regions 101, doped with arsenic (As) or phosphorus (P) to a high impurity concentration, are formed through the openings between polycrystalline silicon layer 8 and insulating films 9. These p type impurity regions 10 and n$^+$ type impurity regions 101 are formed in a self-alignment arrangement by selecting specified values for the impurity concentrations, the diffusion times and the difference of diffusion coefficients of the impurities. The difference of the amounts of diffusion between p type impurity regions 10 and n$^+$ type impurity regions 101 defines the channel below gate insulating film 7. Also, phosphorus (P), for example, is doped into polycrystalline silicon layer 8 and it is given conductivity as a gate electrode. In the case of doping phosphorus (P) n+ type impurity regions 101, the doping of impurity (phosphorus (P)) into polycrystalline silicon layer 8 may be carried out at the same time as the formation of the n+ type impurity regions.

In this way, when p type impurity regions 10 and n+ type impurity regions 101 are formed, the impurity of p+ type semiconductor substrate 1 diffuses further into p− type semiconductor layer 2 and increases the thickness of p+ type impurity layer 1a until it reaches as far as the n+ type buffer layer 3. When elements with a small diffusion coefficient such as arsenic are used as the dopant in n+ type buffer layer 3 as described above, the impurity of the n+ type buffer layer 3 diffuses only very slightly into p− type semiconductor layer 2, and the thickness of n+ type buffer layer 3 is accurately maintained at the specified thickness while remaining at the same high impurity concentration. Also, due to the presence of the p− type semiconductor layer 2, the impurity of p+ type semiconductor substrate 1 does not diffuse to the extend it causes the n+ type buffer layer 3 to disappear. Thus, the thickness and impurity concentration of n+ type buffer layer 3 is virtually guaranteed until the completion of the heat processing of the semiconductor device.

After passing through the whole heat process, the optimum condition is to substitute the p+ type impurity layer 1a for the p− type semiconductor layer 2 and to make the p− type semiconductor layer 2 disappear. However, even if a portion of p− type semiconductor layer 2 remains, in practice this will not create a problem since it is most important that the impurity concentration of n+ type buffer layer 3 should not be changed.

Figure 4F:
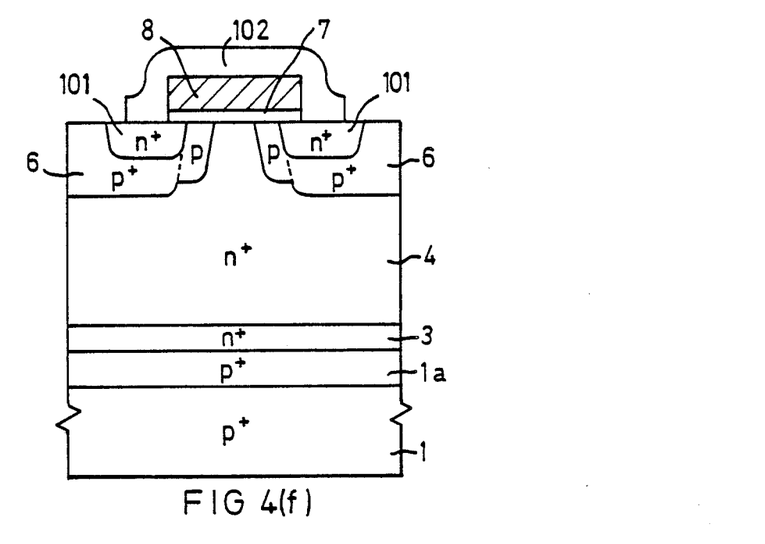

Next, as shown in FIG. 4(f), insulating film 9 is removed, and insulating film 102 is formed to cover gate insulating film 7 and gate electrode 8.

Figure 4G:
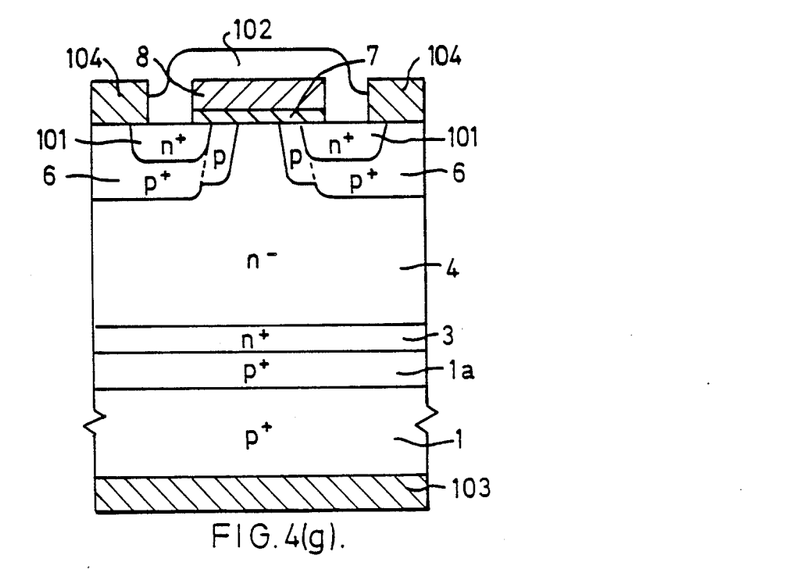

As shown in FIG. 4(g), anode electrode 103 is formed on p+ type semiconductor substrate 1, and cathode electrodes 104 are formed to connect to n+ type impurity regions 101 and p+ type impurity regions 6.

Figure 5:
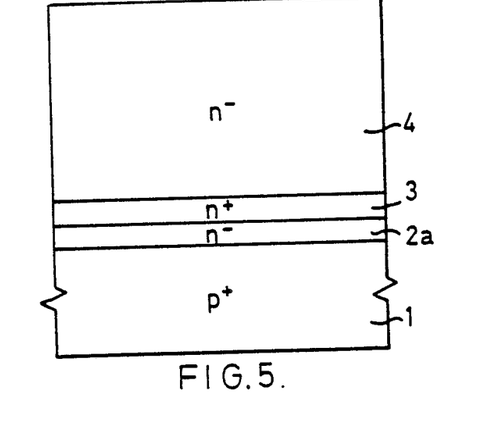
FIG. 5 is a cross-sectional view illustrating the production of a semiconductor device of another embodiment of this invention.

FIG. 5 shows the application of this invention to a device wherein the low concentration p− type semiconductor layer 2 of the previous embodiment is changed to low concentration n− type semiconductor layer 2a. In FIG. 5, the same symbols are used for parts which are the same as in the previous embodiment. First, in the same way as in the previous embodiment, low concentration n− type semiconductor layer 2a is formed on high concentration p+ type semiconductor substrate 1 by epitaxial growth. High concentration n+ type semiconductor layer 3 and low concentration n− type semiconductor layer 4 are successively formed on n− type semiconductor layer 2a by epitaxial growth. Although the n− type semiconductor layer 2a is substituted for the p− type semiconductor layer 2 in the latter process, the result will be the same as in the previous embodiment. Even in this type of production method, the same effect can be obtained as in the production method for the semiconductor device shown in FIG. 4.

Figure 6:
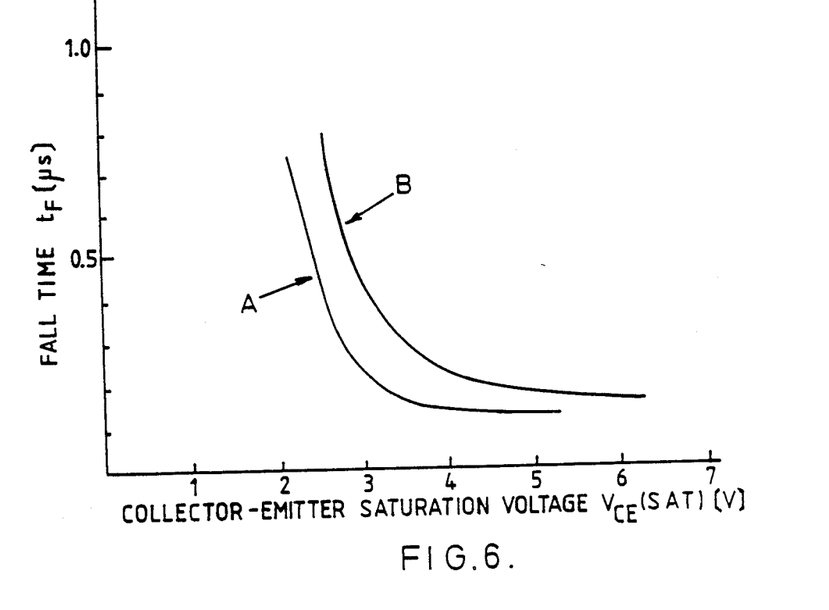
FIG. 6 shows a comparison of the characteristics of an IGBT produced by this invention and by the prior art.

Using the above methods, IGBTs were produced by this invention making the concentration of p+ type semiconductor substrate layer 1 about $10^{19}$ cm$^{-3}$, making the concentration of low concentration p− type semiconductor layer 2 or low concentration n− type semiconductor layer 2a about $10^{16}$ cm$^{-3}$ and their thicknesses 5 um, and making the concentration of n+ type buffer layer 3 about $10^{17}$ cm$^{-3}$ and its thickness 5 um. The thermal diffusion process was carried out for 17 hours at 1100° C. As a result, as shown in FIG. 6, an improvement in the characteristic curve for the IGBT of this invention (A), which relates the falling time of switching (fall time) $t_F$ and the saturation voltage between the collector and the emitter $V_{CE(SAT)}$, compared with the IBGT curve (B) of the prior art can be seen by the shift towards the X and Y axes. For both the IGBT of this invention and of the prior art, these curves are for the case when the current density is made 1.05 A/mm$^2$ by carrying out lifetime control of the carrier of the n− type semiconductor layer.

As is clear from these results, an IGBT with both low $V_{CE}$ and low $t_F$ can be produced by this invention.

Figure 7A:
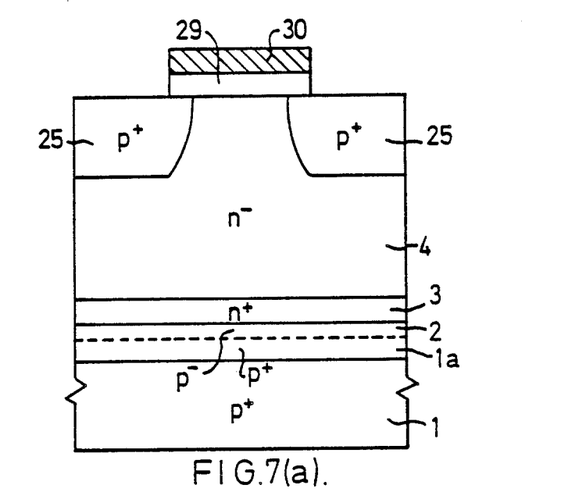
FIG. 7(a) to FIG. 7(c) are cross-sections showing an example in which this invention is applied to the production of an SI thyristor.
Figure 7B:
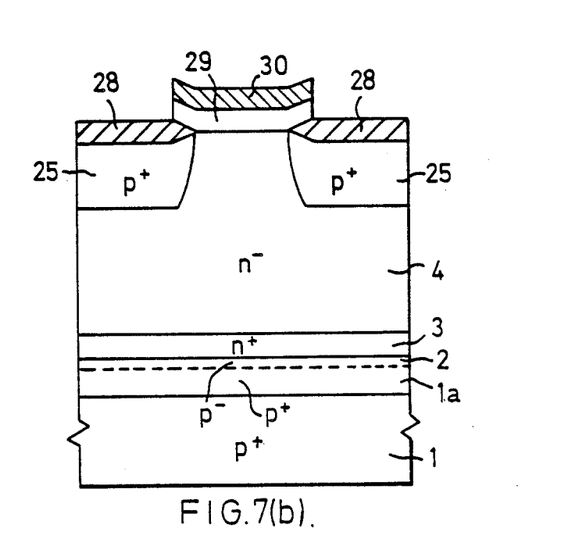
Figure 7C:
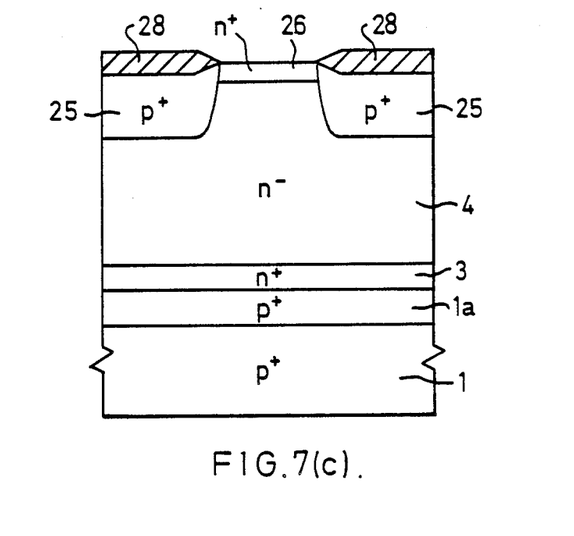

However, although these embodiments all concern IGBT, if the processes in FIG. 4(d) and thereafter are altered to those in FIG. 7(a) to FIG. 7(c), this invention can also be applied to SI thyristors. That is to say, after forming each semiconductor layer to the condition shown in FIg. 5, silicon dioxide film 29 and silicon nitride film 30 are formed on the surface of n− type semiconductor layer 4, as shown in FIG. 7(a), and, after making openings in the estimated regions for the formation of p+ type impurity regions 25, p+ type impurity regions 25 are provided by the thermal diffusion of, for instance, boron (B). N− type semiconductor layer 4 forms a channel below the silicon film 29 and silicon nitride film 30 between p+ type impurity regions 25.

Next, by selectively oxidizing the surface of p+ type impurity regions 25 using silicon nitride film 30, which functions as an oxidation prevention film, as a mask, insulating films 28 are formed on the surfaces of p+ type impurity regions 25, as shown in FIG. 7(b). After this, as shown in FIG. 7(c), silicon dioxide film 29 and silicon nitride film 30 are removed, and n+ type impurity region 26 is formed by thermal diffusion of, for instance, phosphorus (P) using insulating films 28 as masks. Furthermore, the SI thyristor shown in FIG. 2 is completed by providing anode electrode 21 for p+ type semiconductor substrate 1 and cathode electrode 27 for n+ type impurity region 26. Although not illustrated in the drawings, gate electrodes are provided in p+ type impurity regions 25 through openings provided in insulating films 28.

Numerous modifications and variations of the present invention are possible in light of the above teachings. It is therefore to be understood that, within the scope of the appended claims, the present invention can be practiced in a manner other than as specifically described herein.

What is claimed is:

1. A method for manufacturing a vertical conducting power semiconductor device having cathode, anode and gate electrode, comprising the steps of:
   preparing a highly doped semiconductor substrate of a first conductivity type;
   forming a first semiconductor layer on said semiconductor substrate which has a lower impurity concentration than that of said semiconductor substrate;
   forming a highly doped second semiconductor layer of a second conductivity type in said first semiconductor layer;
   forming a lightly doped third semiconductor layer of said second conductivity type on said second semiconductor layer;
   forming a first impurity doped region of said first conductivity type in said third semiconductor layer which is diffused from a surface of said third semiconductor layer by a heating process; and diffusing impurities of first conductivity type of said semiconductor substrate into said first semiconductor layer when said impurity doped region is diffused by said heating process, so as to maintain the impurity concentration of said second semiconductor layer at a constant level and substantially maintain the same thickness.

2. The method for manufacturing a vertical conducting power semiconductor device according to claim 1, wherein said first, second and third semiconductor layers are formed by an epitaxial growth technique.

3. The method of manufacturing a vertical conducting power semiconductor device according to claim 1, wherein said first semiconductor layer has said first conductivity type.

4. The method of manufacturing a vertical conducting power semiconductor device according to claim 1, wherein said first semiconductor layer has said second conductivity type.

5. The method of manufacturing a vertical conducting power semiconductor device according to claim 1, wherein said first semiconductor layer has a high impurity concentration in the range of $10^{18}$–$10^{20}$ cm$^{-3}$ by said diffusing step.

6. The method of manufacturing a vertical conducting power semiconductor device according to claim 1, further comprising the step of forming a second impurity doped region of the second conductivity type within the first impurity doped region.

7. The method of manufacturing a vertical conducting power semiconductor device according to claim 6, wherein said vertical conducting power semiconductor device is an insulated gate bipolar transistor.

8. The method of manufacturing a vertical conducting power semiconductor device according to claim 1, further comprising the step of forming a highly doped second conductivity type region in a surface portion of said lightly doped third semiconductor layer.

9. The method of manufacturing a vertical conducting power semiconductor device according to claim 8, wherein said vertical conducting power semiconductor device is a static induction thyristor.

* * * * *